US012785702B2

(12) United States Patent
Smith

(10) Patent No.: US 12,785,702 B2
(45) **Date of Patent: *Nov. 3, 2026**

(54) LOOP BANDWIDTH CONTROL FOR FRACTIONAL-N FREQUENCY SYNTHESIZER

(71) Applicant: TEXAS INSTRUMENTS INCORPORATED, Dallas, TX (US)

(72) Inventor: Ryan Alexander Smith, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/921,121

(22) Filed: Oct. 21, 2024

(65) Prior Publication Data

US 2025/0047289 A1 Feb. 6, 2025

Related U.S. Application Data

(63) Continuation of application No. 18/190,501, filed on Mar. 27, 2023, now Pat. No. 12,166,493.

(51) Int. Cl.
*H03L 7/099* (2006.01)
*H03L 7/089* (2006.01)
(Continued)

(52) U.S. Cl.
CPC ............ *H03L 7/099* (2013.01); *H03L 7/0898* (2013.01); *H03L 7/1976* (2013.01); *H03L 7/093* (2013.01)

(58) Field of Classification Search
CPC ....... H03L 7/099; H03L 7/093; H03L 7/1976; H03L 7/0898
(Continued)

(56) References Cited

U.S. PATENT DOCUMENTS

2002/0176188 A1 11/2002 Ruegg
2005/0215221 A1 9/2005 Fujita
(Continued)

OTHER PUBLICATIONS

Notification of Transmittal of the International Search Report and the Written Opinion of the ISA, mailed Jul. 19, 2024 12 pgs, submitted in U.S. Appl. No. 18/190,501.

*Primary Examiner* — Arnold M Kinkead
(74) *Attorney, Agent, or Firm* — Michael T. Gabrik; Charles F. Koch

(57) ABSTRACT

Systems and methods for controlling a charge pump current in response to a control voltage provided to a voltage-controlled oscillator (VCO) are disclosed. An example system includes a phase-locked loop including a charge pump and a VCO coupled to the charge pump. Current adjusting circuitry receives the control voltage and controls the charge pump current. The current adjusting circuitry is configurable to cause the charge pump current to increase by a first amount responsive to the control voltage being in a first range, and cause the charge pump current to decrease by a second amount responsive to the control voltage being in a second range. A chirp signal output by the phase-locked loop has a bandwidth defined by a first bandwidth segment that corresponds to the control voltage being in the first range and a second bandwidth segment that corresponds to the control voltage being in the second range.

19 Claims, 7 Drawing Sheets

(51) Int. Cl.
*H03L 7/093* (2006.01)
*H03L 7/197* (2006.01)

(58) Field of Classification Search
USPC ..................................... 331/179, 16, 34, 1 R
See application file for complete search history.

(56) References Cited

U.S. PATENT DOCUMENTS

2006/0139105 A1* 6/2006 Maxim ................. H03L 7/0898 331/16
2007/0132491 A1 6/2007 Kuo
2012/0319786 A1* 12/2012 Kumar ...................... H03L 7/18 331/1 R
2019/0319582 A1 10/2019 Heschl

* cited by examiner

LOOP BANDWIDTH CONTROL FOR FRACTIONAL-N FREQUENCY SYNTHESIZER

CROSS-REFERENCE TO RELATED APPLICATION

This U.S. Patent Applications is a continuation of U.S. patent application Ser. No. 18/190,501, filed Mar. 27, 2023, now U.S. Pat. No. 12,166,493, the content of which is incorporated by reference herein.

BACKGROUND

A phase-locked loop (PLL) is a system that compares the frequency of a local oscillator to that of a received input signal, and uses a feedback loop to lock the local oscillator's frequency to that of the received input signal. The output frequency of the local oscillator may be a multiple of the input frequency. A PLL may include a phase frequency detector (PFD), charge pump, loop filter, and voltage-controlled oscillator (VCO). A frequency synthesizer in a frequency modulated continuous wave (FMCW) radar system, such those used in automotive and industrial applications, may use a PLL to transmit a signal that has a frequency that ramps up over time, referred to as a chirp signal.

SUMMARY

In accordance with at least one example of the description, a system includes a phase-locked loop including a charge pump, and a voltage-controlled oscillator (VCO) coupled to the charge pump. The VCO is configured to receive a control voltage, and the phase-locked loop is configured to output a chirp signal based on the control voltage. The system further includes current adjusting circuitry configured to receive the control voltage and control a bias current provided to the charge pump. The current adjusting circuitry is configurable to increase the bias current by a first amount responsive to the control voltage being in a first range, and decrease the bias current by a second amount responsive to the control voltage being in a second range. The chirp signal has a bandwidth defined by a first bandwidth segment that corresponds to the control voltage being in the first range and a second bandwidth segment that corresponds to the control voltage being in the second range.

In accordance with at least one example of the description, a method includes outputting, by a charge pump in a phase-locked loop, a charge pump current; providing a control voltage to a voltage-controlled oscillator (VCO) in the phase-locked loop; causing, by current adjusting circuitry, the charge pump current to increase by a first amount, responsive to the control voltage being within a first range; causing, by the current adjusting circuitry, the charge pump current to decrease by a second amount responsive to the control voltage being within a second range; and causing, by current adjusting circuitry, the charge pump current to increase by a third amount, responsive to the control voltage being within a third range.

In accordance with at least one example of the description, a system includes a phase-locked loop including a charge pump, and a voltage-controlled oscillator (VCO) coupled to the charge pump. The VCO is configured to receive a control voltage, and the phase-locked loop is configured to output a chirp signal based on the control voltage. The system further includes current adjusting circuitry configured to receive the control voltage and control a charge pump current output by the charge pump. The current adjusting circuitry is configurable to cause the charge pump current to increase by a first amount responsive to the control voltage being in a first range, and cause the charge pump current to decrease by a second amount responsive to the control voltage being in a second range. The chirp signal has a bandwidth defined by a first bandwidth segment that corresponds to the control voltage being in the first range and a second bandwidth segment that corresponds to the control voltage being in the second range

BRIEF DESCRIPTION OF THE DRAWINGS

The same reference numbers or other reference designators are used in the drawings to designate the same or similar (functionally and/or structurally) features.

DETAILED DESCRIPTION

Figure 1:
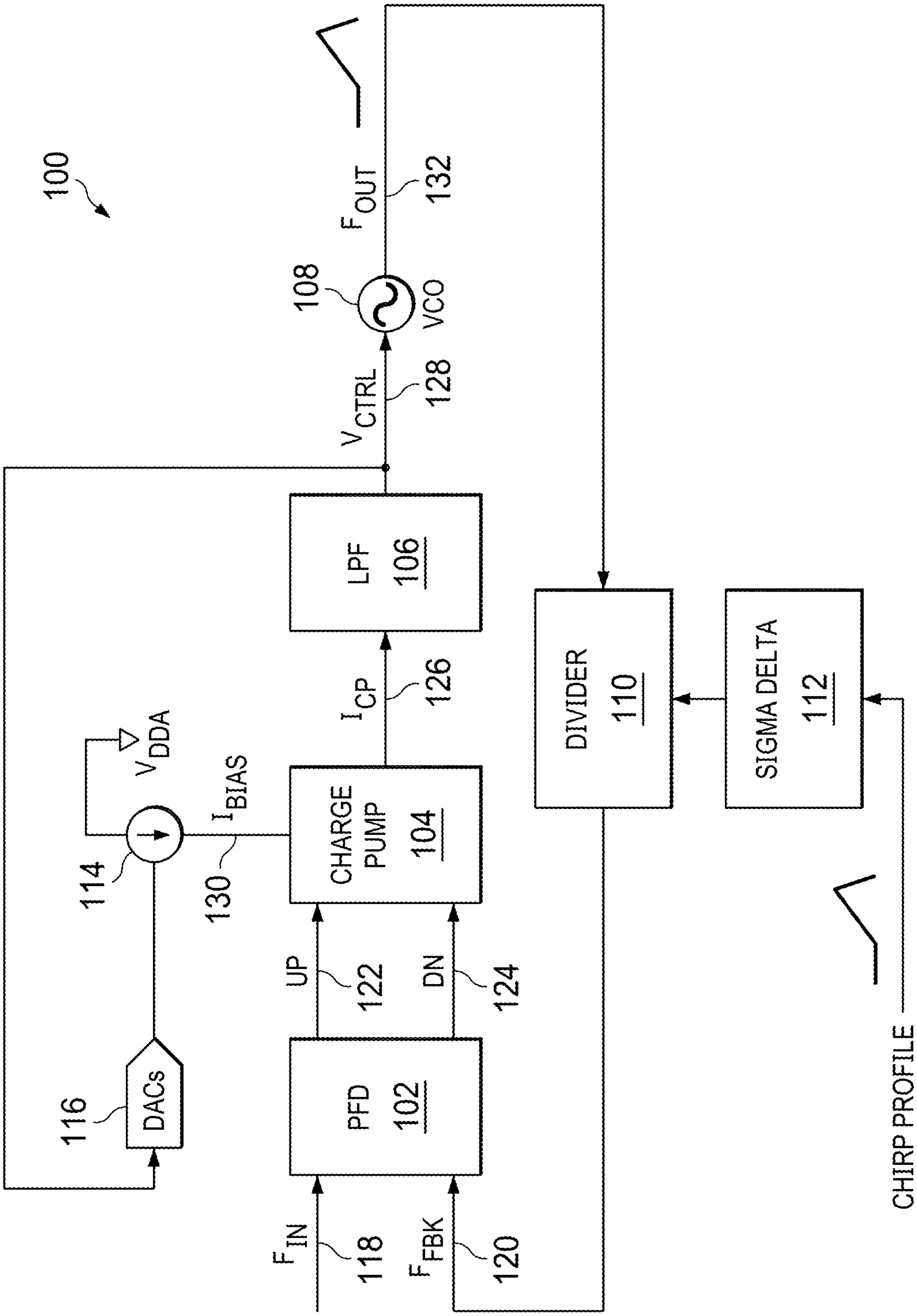
FIG. 1 is a block diagram of a PLL in accordance with various examples.

A PLL receives an input reference signal Fix having a relatively stable frequency at an input and produces an output signal with a frequency that is a multiple of the reference signal at an output, referred to as Four. The PLL also locks the phase of the output signal with the input signal. A PLL may include a PFD followed by a charge pump. The PFD receives the reference signal FIN and a feedback signal FEBK at its two inputs, and determines whether one of the two inputs has a slower frequency or a lagging phase. The PFD provides one or more phase error output signals (e.g., an up signal and a down signal). The charge pump receives the phase error output signal(s) from the output of the PFD and converts those signals into a push or pull of current into or out of a loop filter. The charge pump generates the control voltage $V_{CTRL}$ for the VCO, which controls the frequency of the VCO. A loop filter may reside between the charge pump and the VCO.

For automotive and industrial radar systems, the PLL may be used to produce a radar-frequency signal for transmission that has a consistent amplitude and a frequency that changes (e.g., increases) substantially linearly over time from a lower frequency bound to an upper frequency bound. The chirp signal produced by the PLL may have a wide bandwidth. Accordingly, it is beneficial for the VCO to have a wide continuous tuning range to produce a chirp signal with a wide bandwidth. The VCO may include a varactor, which is a voltage-controlled capacitor, used to control the frequency of the radar-frequency output signal. The varactor's capacitance is changed by varying the control voltage $V_{CTRL}$, which creates the frequency change in the chirp signal. The relationship between $V_{CTRL}$ and the frequency is referred to as the VCO gain (e.g., the $K_{VCO}$), and is expressed in Hertz per volt (Hz/V). The $K_{VCO}$ may change in a non-linear way with the change in $V_{CTRL}$. If the $K_{VCO}$ changes as $V_{CTRL}$, changes, the loop bandwidth may also change with the change in $V_{CTRL}$. If the loop bandwidth is not consistent across the chirp, phase noise variation could be created, where some frequencies are noisier than others. Also, the loop bandwidth may have to be constrained to the worst case scenario (e.g., the highest $K_{VCO}$), which could allow too much reference clock noise.

In examples herein, the charge pump current $I_{CP}$ may be varied with $V_{CTRL}$ to compensate for the variation in $K_{VCO}$ caused by the change in $V_{CTRL}$. As described below, the loop bandwidth is proportional to both $K_{VCO}$ and to the charge pump current $I_{CP}$. Therefore, if $K_{VCO}$ is low for a first range of $V_{CTRL}$ values, $I_{CP}$ may be increased to provide a consistent bandwidth for that first range of $V_{CTRL}$ values. If $K_{VCO}$ is high for a second range of $V_{CTRL}$, values, $I_{CP}$ may be decreased to provide a consistent bandwidth for that second range of $V_{CTRL}$ values. $I_{CP}$ may be varied inversely to the variation in $K_{VCO}$ across the full range of $V_{CTRL}$ values used for producing the chirp. $I_{CP}$ may be varied using circuitry that increases or decreases the bias current provided to the charge pump responsive to the value of $V_{CTRL}$. One or more current-steering digital-to-analog converters (DACs) are used in one example to vary the $I_{CP}$. A current-steering DAC may have a variety of configurations. In this example, the current-steering DACs have a binary input and produce an analog output in the form of a current, based on the voltage values provided at the binary inputs. The current-steering DACs may be tuned or trimmed to provide the appropriate current to compensate for the variation in $K_{VCO}$ for a given VCO. With the examples herein, the full bandwidth for the chirp may be produced by a single VCO, which reduces area and power consumption for a radar system.

FIG. 1 is a block diagram of a PLL circuit 100 in accordance with various examples herein. PLL 100 is a fractional-N PLL in one example. A fractional-N PLL can produce output frequencies that are not limited to integer multiples of the input frequency. The fractional-N PLL includes additional circuitry that allows it to accurately interpolate between integer multiples of the reference frequency. PLL 100 includes a PFD 102, a charge pump (CP) 104, a low-pass filter (LPF) 106, and a VCO 108. PLL 100 also includes a divider 110, a sigma-delta modulator 112, and a bias current source 114. DACs 116 are coupled to bias current source 114.

PFD 102 includes a first input 118 that receives a reference signal Fix and a second input 120 that receives a feedback signal $F_{FBK}$. PFD 102 provides up or down signals (e.g., UP signals 122 or DN signals 124) to charge pump 104 based on the difference between the reference signal FIN and the feedback signal FEBK. If PFD 102 sends an UP signal to charge pump 104, charge pump 104 delivers a pull-up current to LPF 106. The charge pump current is shown as $I_{CP}$ 126 in PLL 100. The pull-up current raises a voltage $V_{CTRL}$ 128, which is provided to VCO 108 by LPF 106. If PFD 102 sends a DN signal to charge pump 104, charge pump 104 pulls down current from LPF 106, which lowers $V_{CTRL}$ 128. The base current provided by charge pump 104 is proportional to $I_{BIAS}$ 130, provided by bias current source 114. Increasing or decreasing $I_{BIAS}$ 130 will result in an increase or decrease in $I_{CP}$ 126. As $I_{CP}$ 126 changes, $V_{CTRL}$ 128 provided to VCO 108 changes. VCO 108 receives the $V_{CTRL}$ 128 signal and produces the Four signal 132, where the frequency of Four is based on the value of $V_{CTRL}$ 128. In PLL 100, divider 110 provides feedback, and sigma-delta modulator 112 allows for feedback that is not integer-based.

Divider 110 may provide integer values, and sigma-delta modulator 112 allows values between integers by quickly sending alternating integer values. The chirp profile provides the frequency range for the chirp in one example.

Because the PLL 100 is used to produce a signal Four 132 that changes in time in a carefully controlled manner, it is beneficial for the PLL 100 to have a consistent, linear, and predictable response to the various control signals. As noted above, the relationship between $V_{CTRL}$ 128 and Four 132 may not be linear, and in some embodiments, a compensation is applied by adjusting controls that affect $V_{CTRL}$ 128, such as $I_{CP}$ 126.

Figure 2:
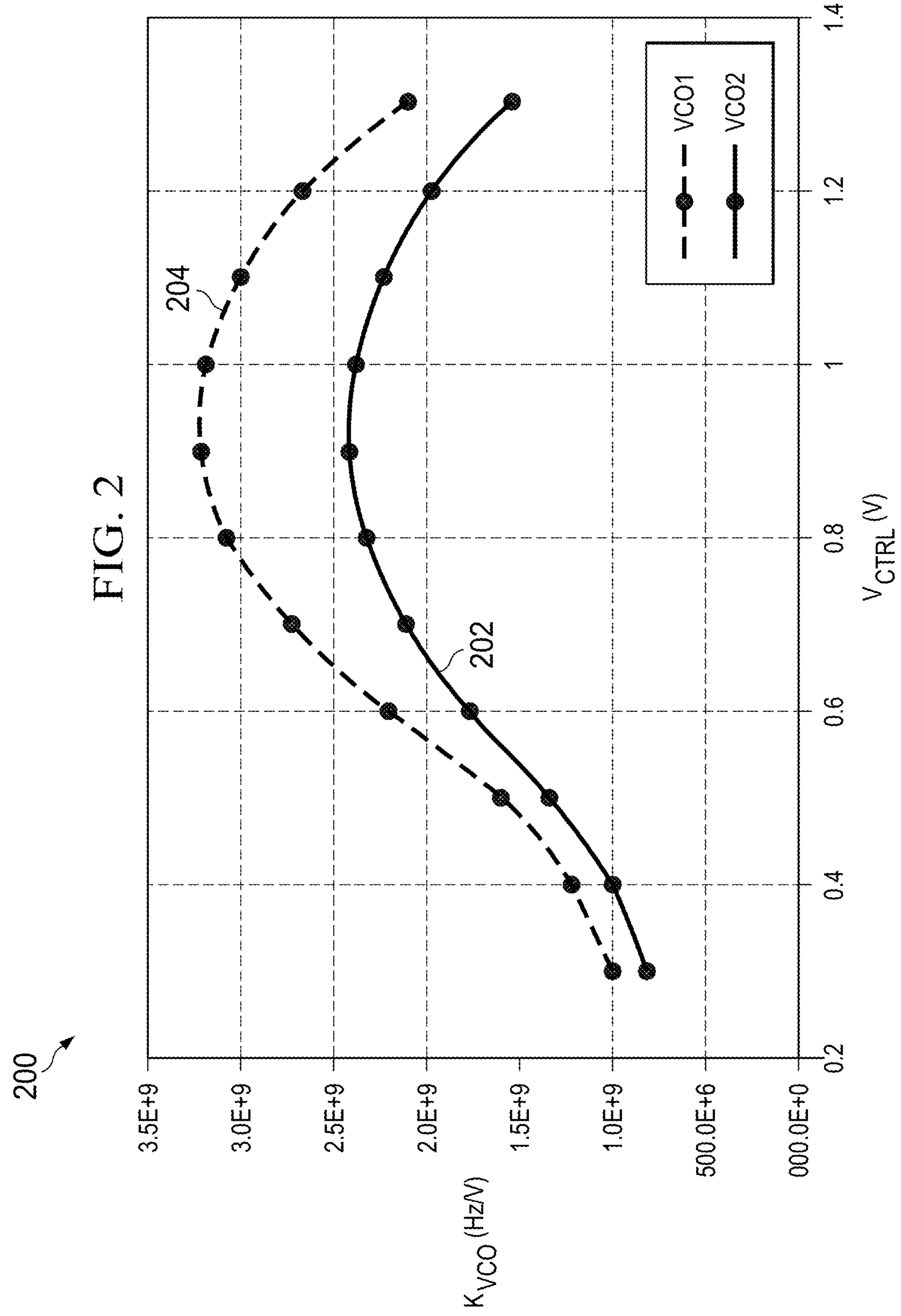
FIG. 2 is a graph of VCO gain versus VCO control voltage in accordance with various examples.

In one example, $K_{VCO}$ versus $V_{CTRL}$ 128 is determined for PLL 100 via testing. Ideally, $K_{VCO}$ is flat and does not change as $V_{CTRL}$ 128 changes. However, testing may show that $K_{VCO}$ is high for some ranges of $V_{CTRL}$ 128 and low for other ranges of $V_{CTRL}$ 128, as shown in FIG. 2. Referring again to FIG. 1, DACs 116 are configured to increase or decrease the value of $I_{BIAS}$ 130 based on the value of $V_{CTRL}$ 128. DACs 116 may push or pull current into or out of bias current source 114 to change the value of $I_{BIAS}$ 130 and thereby apply an adjustment to $V_{CTRL}$ 128. As $V_{CTRL}$ 128 changes, $K_{VCO}$ will change, and $I_{BIAS}$ 130 is altered via DACs 116 to counter the changes in $K_{VCO}$ to produce a consistent bandwidth across the range of $V_{CTRL}$ 128 values. Each DAC 116 is an example of a bias compensation circuit, and other embodiments may include other types of bias compensation circuits to control the bias current $I_{BIAS}$ 130 in response to $V_{CTRL}$ 128. Additional description of this process is provided with respect to FIGS. 2-6 below.

FIG. 2 is a graph 200 of $K_{VCO}$ versus $V_{CTRL}$ 128 in accordance with various examples. In graph 200, the x-axis represents $V_{CTRL}$ 128 in volts. The y-axis represents $K_{VCO}$ in Hz/V. Graph 200 has two curves, 202 and 204. Curve 202 represents a first example VCO, labeled as VCO1, which may be typical of a 77 GHz automotive radar system. Curve 204 represents a second example VCO, labeled as VCO2, which may be typical of a 60 GHz automotive or industrial radar system. In one example, VCO1 has a 1.25 GHz bandwidth, and VCO2 has a 2.33 GHZ bandwidth, and these bandwidths may be multiplied to provide higher frequencies with circuitry not shown herein.

As shown in graph 200, $K_{VCO}$ varies as $V_{CTRL}$ 128 varies. For example, at a $V_{CTRL}$ 128 value of 0.4 V, $K_{VCO}$ for VCO2 (curve 204) is approximately $1.2\times10^9$ Hz/V. At a $V_{CTRL}$ 128 value of 0.9 V, $K_{VCO}$ for VCO2 is approximately $3.2\times10^9$ Hz/V. Finally, at a $V_{CTRL}$ 128 value of 1.3 V, $K_{VCO}$ for VCO2 is approximately $2.1\times10^9$ Hz/V. Curve 202 for VCO1 shows a similar pattern. The third-order waveforms shown for curves 202 and 204 indicate that an example VCO with a wide tuning range may have a $K_{VCO}$ that changes in a non-linear manner. The examples herein provide systems and methods for varying charge pump current $I_{CP}$ 126 to counter the non-linearity of the $K_{VCO}$ curves shown in graph 200 and result in a uniform loop bandwidth.

Figure 3:
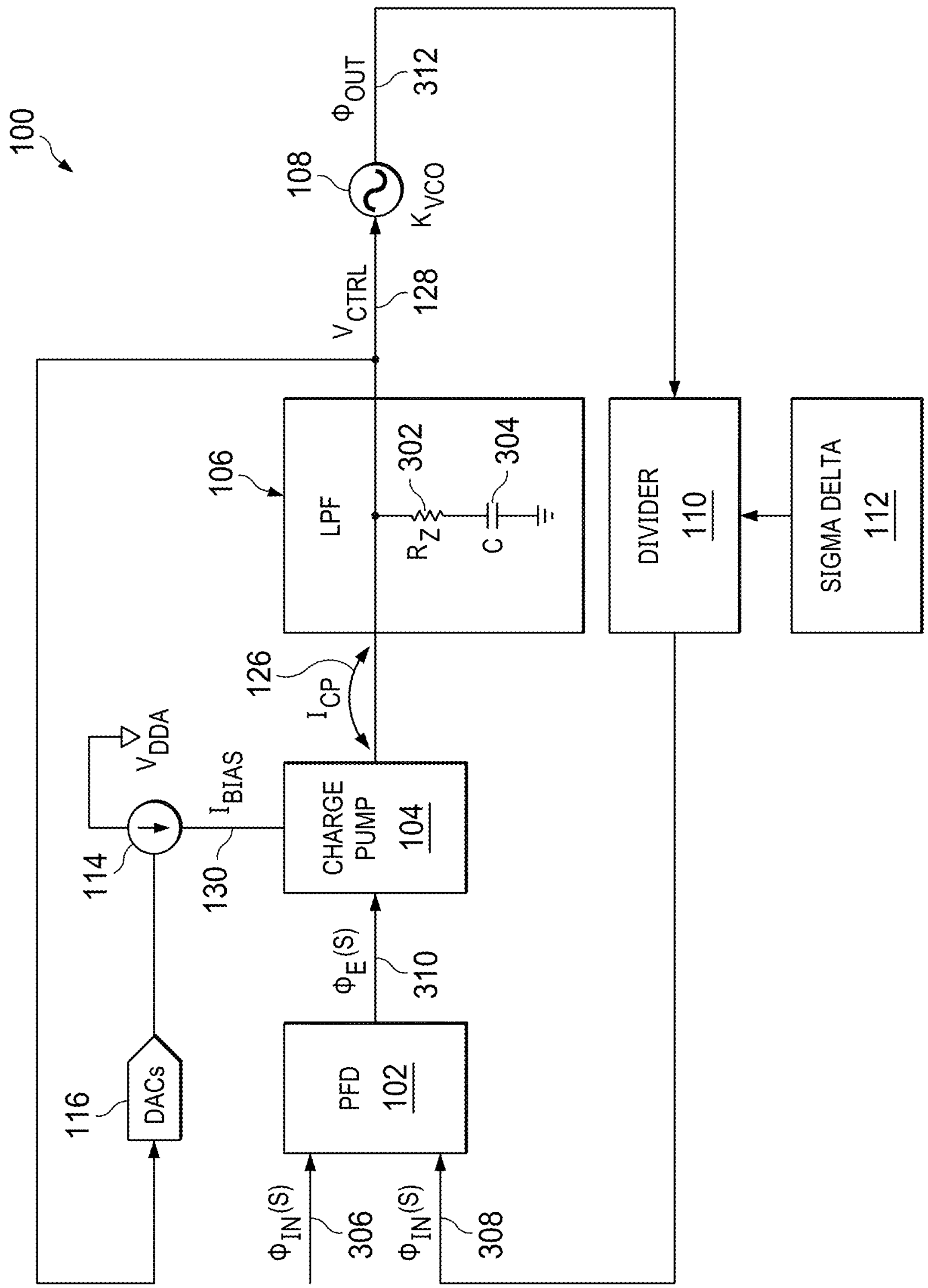
FIG. 3 is a block diagram of a PLL in accordance with various examples.

FIG. 3 is a block diagram of PLL 100 in accordance with various examples herein. The components of PLL 100 and their operation is described above with respect to FIG. 1. FIG. 3 is a phase domain block diagram that shows the phase transfer function of PLL 100. In this example, LPF 106 includes a resistance Ry 302 and a capacitance C 304. Various phases of the signal are labeled in FIG. 3. For example, $\Phi_{IN}(s)$ 306 is the phase of input reference signal FIN and $\Phi_{FBK}(S)$ 308 is the phase of feedback signal $F_{FBK}$. DE(s) 310 is the phase error signal(s), and $\Phi_{OUT}(s)$ 312 is the phase of Four signal 132. The phase transfer function for PLL 100 is shown in Equation (1):

$$\frac{\Phi_{OUT}(s)}{\Phi_E(s)} = \left(\left(I_{CP} * K_{VCO}/M\right) * (1 + sCR_Z)\right)/S^2C \quad (1)$$

In Equation (1), $\Phi_E(s)$ is the phase error signal, M is the feedback divider ratio of divider 110, $I_{CP}$ is the charge pump current $I_{CP}$ 126, and $K_{VCO}$ is the VCO gain in Hz/V. In Equation (1), $R_Z$ is the zero resistor of LPF 106 and C is the capacitance 304. The bandwidth (BW) of this example PLL 100 may be estimated by Equation (2):

$$BW \sim (I_{CP} * K_{VCO} * R_Z)/(2 * \pi * M) \quad (2)$$

Bandwidth is therefore proportional to charge pump current $I_{CP}$ 126, $K_{VCO}$, and $R_Z$. As shown in Equation (2), if $K_{VCO}$ varies extensively, the bandwidth will vary as well. FIG. 2 shows that for some VCOs, $K_{VCO}$ varies as $V_{CTRL}$ 128 changes. Therefore, as $V_{CTRL}$ 128 changes to produce a chirp, the loop bandwidth will vary as well. As described above, if the loop bandwidth is not consistent across the chirp, phase noise variation could be created. Also, the loop bandwidth may have to be constrained to the worst case scenario (e.g., the highest $K_{VCO}$), which reduces the bandwidth of the chirp signal.

Equation (2) shows that bandwidth varies with $K_{VCO}$. However, bandwidth also varies with $I_{CP}$ 126. The other values in Equation (2) are constant. Therefore, to produce a consistent bandwidth across $V_{CTRL}$ 128 values, $I_{CP}$ 126 may be varied inversely to the variation in $K_{VCO}$ caused by the change in $V_{CTRL}$ 128. As an example, if $K_{VCO}$ is low for a given $V_{CTRL}$ 128, $I_{CP}$ 126 may be raised. If $K_{VCO}$ is high for a given $V_{CTRL}$ 128, $I_{CP}$ 126 may be lowered. By adjusting $I_{CP}$ 126 based on the measured variation in $K_{VCO}$ versus $V_{CTRL}$ 128, a more consistent bandwidth may be realized with PLL 100. In examples herein, current-steering DACs 116 are configured to increase or decrease the value of $I_{BIAS}$ 130 based on the value of $V_{CTRL}$ 128. DACs 116 may push or pull current into or out of bias current source 114 to change the value of $I_{BIAS}$ 130. $I_{CP}$ 126 varies with $I_{BIAS}$ 130, and therefore this process causes $I_{CP}$ 126 to be varied with the change in $V_{CTRL}$ 128 and compensate for the variations in $K_{VCO}$ across the $V_{CTRL}$ 128 range.

Figure 4:
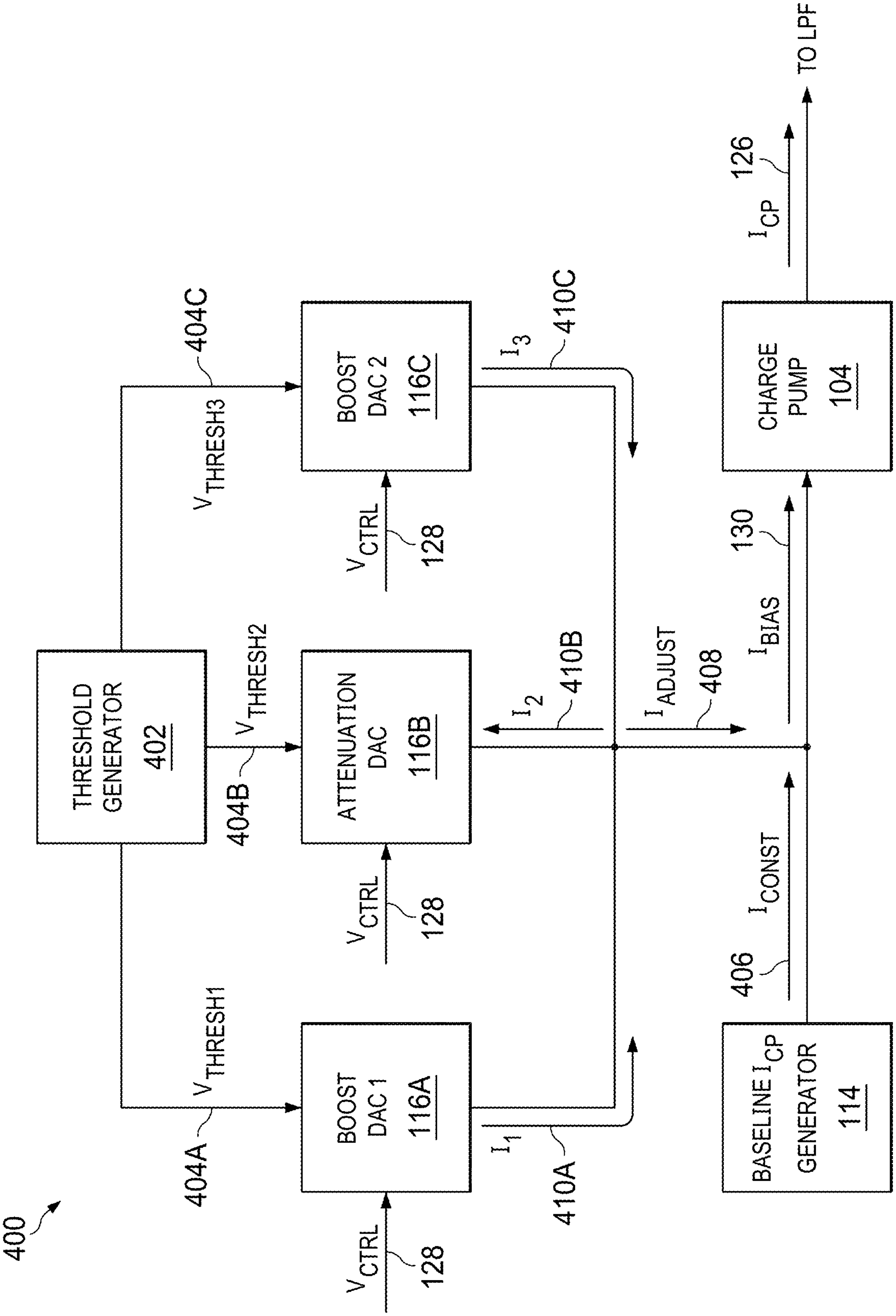
FIG. 4 is a block diagram of a circuit for varying charge pump current in accordance with various examples.

FIG. 4 is a block diagram of a circuit 400 for varying $I_{CP}$ 126 in accordance with various examples herein. Circuit 400 includes one or more DACs 116 that push or pull current into or out of bias current source 114 to change the value of $I_{BIAS}$ 130, which varies $I_{CP}$ 126. DACs 116 are configured to push or pull current based on the value of $V_{CTRL}$ 128. As described above, each DAC 116 is an example of a bias compensation circuit, and other embodiments may include other types of bias compensation circuits to control the bias current $I_{BIAS}$ 130 in response to $V_{CTRL}$ 128.

Circuit 400 includes bias current source 114, charge pump 104, DACs 116A, 116B, and 116C (collectively DACs 116), and threshold generator 402. Any number of DACs 116 may be present in other examples. Three DACs are useful in this example. Threshold generator 402 may include a memory configured to store voltage threshold values for each DAC 116 that govern when the respective DAC 116 is active and how much current to source or sink for a given value of $V_{CTRL}$ 128. Threshold generator 402 may be a voltage threshold generator circuit in some examples and include any suitable circuitry for generating threshold voltages, such as a resistor network. In another example, threshold generator 402 may be circuitry configured to provide voltage threshold values. Threshold generator 402 produces $V_{THRESH1}$ 404A for DAC 116A, $V_{THRESH2}$ 404B for DAC 116B, and $V_{THRESH3}$ 404C for DAC 116C. Each DAC 116 also receives $V_{CTRL}$ 128, so the DAC 116 can compare $V_{CTRL}$ 128 to the DAC's voltage threshold value, and turn on or off based on the comparison. Turning the DACs 116 on or off operates to push or pull current to or from bias current source 114 to adjust $I_{CP}$ 126.

Bias current source 114 generates the baseline current for $I_{CP}$ 126. This baseline current is $I_{CONST}$ 406 in this example. The current provided by DACs 116, based on the value of $V_{CTRL}$, is adjusted current $I_{ADJUST}$ 408. $I_{ADJUST}$ 408 may be positive or negative in examples herein. $I_{CONST}$ 406 combines with $I_{ADJUST}$ 408 to create $I_{BIAS}$ 130, which is provided to charge pump 104. Charge pump 104 provides $I_{CP}$ 126 to LPF 106 based on the value of $I_{BIAS}$ 130. If $I_{BIAS}$ 130 increases, $I_{CP}$ 126 increases. If $I_{BIAS}$ 130 decreases, $I_{CP}$ 126 decreases.

As shown in Equation (2) described above, the loop bandwidth is proportional to $I_{CP}$ 126 and to $K_{VCO}$. If $K_{VCO}$ is low, $I_{CP}$ 126 may be increased to equalize the loop bandwidth. If $K_{VCO}$ is high, $I_{CP}$ 126 may be decreased to equalize the loop bandwidth. Because $K_{VCO}$ varies with $V_{CTRL}$ 128, the value of $V_{CTRL}$ 128 may be useful for determining whether to increase or decrease $I_{CP}$ 126. DACs 116 each receive $V_{CTRL}$ 128 and compare $V_{CTRL}$ 128 to the $V_{THRESH}$ value received from threshold generator 402. Then, each DAC 116 will turn on or off responsive to the comparison. In this example, DAC 116A and DAC 116C are boost DACs. Boost DACs provide a positive current to $I_{ADJUST}$ 408 if they are turned on. DAC 116B is an attenuation DAC in this example. Attenuation DACs pull current from $I_{ADJUST}$ 408 if they are turned on. Therefore, by selectively turning on or off DACs 116 based on the value of $V_{CTRL}$ 128, $I_{ADJUST}$ 408 may be changed to alter the value of $I_{BIAS}$ 130, which in turn alters $I_{CP}$ 126 to adjust for the varying $K_{VCO}$.

In one example, the $K_{VCO}$ curve for a PLL 100 is curve 204 in FIG. 2. As shown in FIG. 2, if $V_{CTRL}$ 128 is low (e.g., less than 600 mV), $K_{VCO}$ is low. Therefore, loop bandwidth will be lower for this voltage range of $V_{CTRL}$ 128 if no compensation is performed. In this example, if $V_{CTRL}$ 128 is less than 600 mV, DAC 116A turns on. $V_{THRESH1}$ 404A is set at approximately 600 mV. DAC 116A compares $V_{CTRL}$ 128 to $V_{THRESH1}$ 404A. If $V_{CTRL}$ 128 is lower, a transistor in DAC 116A coupled to the $V_{CTRL}$ 128 input turns on and increases the current I1 410A provided by DAC 116A, which increases current $I_{ADJUST}$ 408. DACs 116 may use current mirrors and other internal circuitry to push or pull current as described herein. In this example, DACs 116B and 116C are off if $V_{CTRL}$ 128 is below 600 mV. Therefore, currents I2 410B from DAC 116B and I3 410C from DAC 116C are approximately zero if $V_{CTRL}$ 128 is below 600 mV. The increase in $I_{ADJUST}$ 408 if $V_{CTRL}$ 128 is below 600 mV increases $I_{CP}$ 126, which compensates for the low $K_{VCO}$ for this $V_{CTRL}$ 128 range (as shown in FIG. 2).

As $V_{CTRL}$ 128 rises above 600 mV, DAC 116A turns off and stops providing current I1 410A. If the range of $V_{CTRL}$ 128 is between 600 mV and 1100 mV, DAC 116B turns on. DAC 116B may be configured to turn on within any suitable voltage range for $V_{CTRL}$ 128. If $V_{CTRL}$ 128 is between this example voltage range of 600 to 1100 mV, DAC 116B turns on. DAC 116B is an attenuation DAC, and pulls current from $I_{BIAS}$ 130. Current I2 410B is current that is sunk from charge pump 104, and therefore $I_{ADJUST}$ 408 is negative during this stage when DAC 116B is on. If DAC 116B pulls or sinks current, then $I_{CP}$ 126 falls if $V_{CTRL}$ 128 is within the above range. As shown in FIG. 2, if $V_{CTRL}$ 128 is between approximately 600 and 1100 mV, $K_{VCO}$ is high, and therefore $I_{CP}$ 126 should be lowered to compensate within this voltage range. An attenuation DAC like DAC 116B lowers $I_{CP}$ 126 if $K_{VCO}$ is high, and therefore provides a more consistent bandwidth across this $V_{CTRL}$ 128 range.

In this example, as $V_{CTRL}$ 128 rises above 1100 mV, DAC 116B turns off and current I2 410B falls to zero. DAC 116C is configured to turn on if $V_{CTRL}$ 128 reaches approximately 1100 mV. For values of $V_{CTRL}$ 128 above 1100 mV, DAC 116C provides current I3 410C to $I_{ADJUST}$ 408. DAC 116C is a boost DAC, and provides a positive current I3 410C. Within this voltage range for $V_{CTRL}$ 128, $I_{ADJUST}$ 408 increases, causing $I_{CP}$ 126 to increase. Because $K_{VCO}$ is lower for higher $V_{CTRL}$ 128 values in this voltage range (as shown in FIG. 2), raising $I_{CP}$ 126 for this voltage range compensates for the lower $K_{VCO}$ and provides a flatter bandwidth across the full voltage range of $V_{CTRL}$ 128.

Referring again to FIG. 2, an example $K_{VCO}$ curve such as curve 204 indicates a lower $K_{VCO}$ at low $V_{CTRL}$ 128, a higher $K_{VCO}$ at a mid-range $V_{CTRL}$ 128, and a lower $K_{VCO}$ at high $V_{CTRL}$ 128. DACs 116 compensate for this varying $K_{VCO}$ by increasing $I_{CP}$ 126 at low $V_{CTRL}$ 128, decreasing $I_{CP}$ 126 at mid-range $V_{CTRL}$ 128, and increasing $I_{CP}$ 126 again at high $V_{CTRL}$ 128. As shown in Equation (2), the loop bandwidth is proportional to the product of $I_{CP}$ 126 and $K_{VCO}$. By raising $I_{CP}$ 126 if $K_{VCO}$ is low, and lowering $I_{CP}$ 126 if $K_{VCO}$ is high, a more consistent bandwidth is realized across the $V_{CTRL}$ 128 range.

In other examples, a different number of DACs 116 may be useful. The third-order $K_{VCO}$ curves 202 and 204 (or similar curves) shown in FIG. 2 may be compensated with the three DACs 116 shown in FIG. 4, with two boost DACs 116 and one attenuation DAC 116. In other examples, the $K_{VCO}$ curve may have a different shape, and a different configuration of DACs 116 may be useful. Other examples may use only one or two DACs 116 to provide compensation. In another example with a more complex $K_{VCO}$ curve, more than three DACs 116 may be useful. The DACs 116 may also be configured for any range of $V_{CTRL}$ 128 values. In some examples, an attenuation DAC 116 may be useful for a low or high $V_{CTRL}$ 128 value, while a boost DAC 116 may be useful for the mid-range $V_{CTRL}$ 128 values. Any suitable configuration of DACs 116 and threshold values $V_{THRESH}$ 404 may be useful in other examples.

The values for $V_{CTRL}$ 128 that turn on or off DACs 116 are examples, and other voltage values may be used in other examples. Also, the ranges for turning on DACs 116 may overlap in some examples. For example, for a small window of $V_{CTRL}$ 128, both DAC 116A and DAC 116B may be on, based on the values of $V_{THRESH1}$ 404A and $V_{THRESH2}$ 404B. As $V_{CTRL}$ 128 increases or decreases, one of DAC 116A or 116B may turn off as determined by the $V_{THRESH}$ values.

Bias current source 114 may include any suitable circuitry to provide the current $I_{CONST}$ 406, which is combined with $I_{ADJUST}$ 408 to produce $I_{BIAS}$ 130. Threshold generator 402 may include any suitable circuitry to provide voltage threshold values $V_{THRESH}$ 404 to the DACs 116, which determine when the DACs 116 turn on or off. In one example, threshold generator 402 includes a resistor network with a number of taps, and a specific tap is selected for each DAC 116 to provide a suitable $V_{THRESH}$ 404 for that DAC 116.

In an example, the $K_{VCO}$ curve (as shown in FIG. 2) is determined via testing for a given PLL 100. Then, circuitry such as that described in FIG. 4 (e.g., DACs 116 and threshold generator 402) may be implemented to provide a desired $I_{CP}$ 126 based on a given $V_{CTRL}$ 128. Circuitry may be trimmed or tuned to provide the appropriate voltage thresholds for turning on or off the DACs 116, and for providing the appropriate amount of current from the DACs 116 (e.g., currents 410A, 410B, and 410C). Any appropriate circuitry may be useful in other examples. The use of bias current source 114, DACs 116, and threshold generator 402 are one example of implementing the system described herein.

Figure 5:
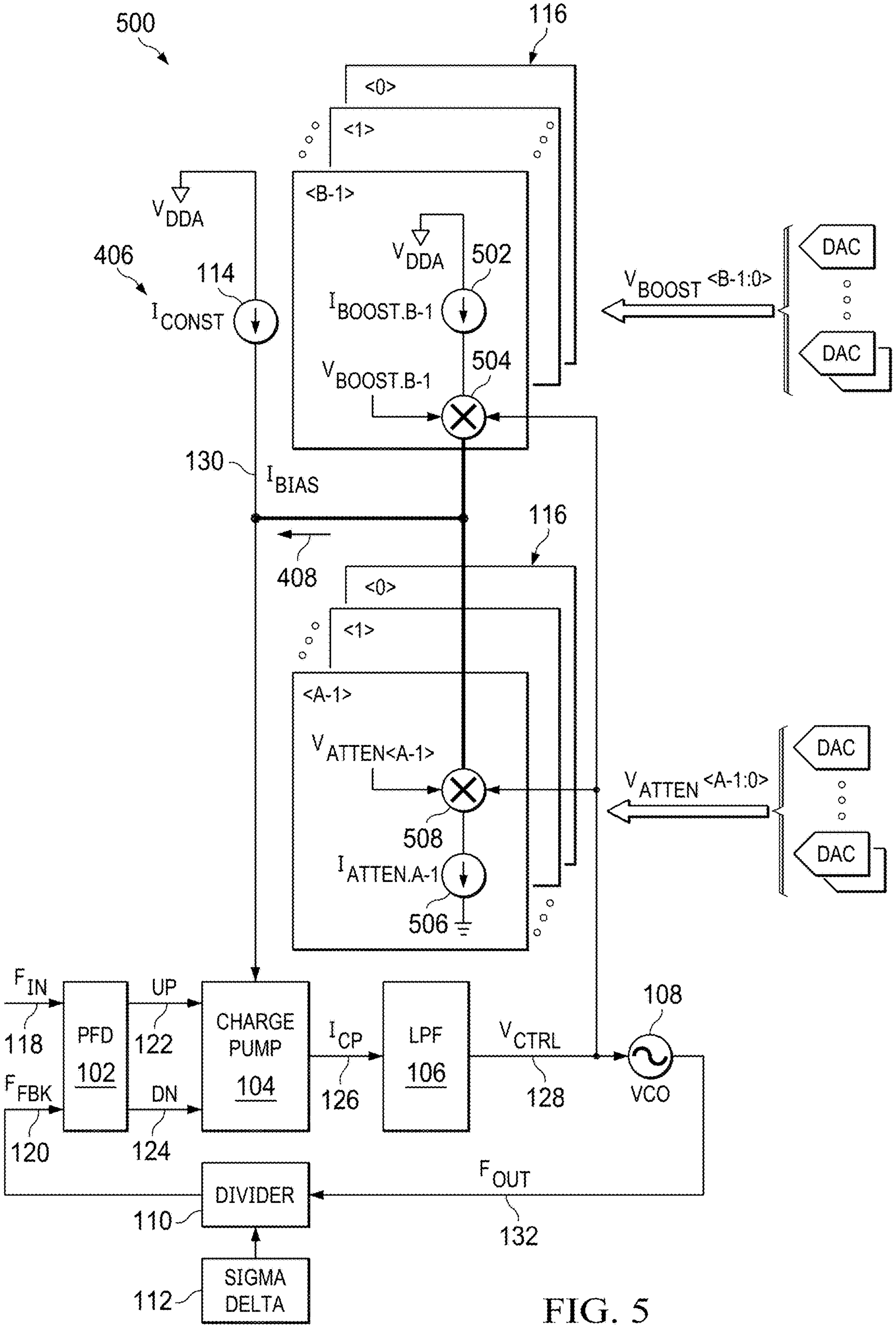
FIG. 5 is a block diagram of a circuit for varying charge pump current in accordance with various examples.

FIG. 5 is a block diagram of a circuit 500 for varying $I_{CP}$ 126 in accordance with various examples herein. Circuit 500 includes the components of PLL 100 described above with respect to FIG. 1. Circuit 500 also includes a number of attenuation DACs 116 (represented by "A") and a number of boost DACs 116 (represented by "B"). A and B may be any number in examples herein. Circuit 500 shows how DACs 116 are configured to boost or attenuate the current $I_{BIAS}$ 130 responsive to the value of $V_{CTRL}$ 128.

In circuit 500, B boost DACs 116 are shown, numbered from <0> to <B-1>. Each boost DAC 116 includes a representative current source 502 and a voltage comparator 504. The current source 502 for DAC 116 <B-1> produces a current $I_{BOOST,B\text{-}1}$, which is current 410 in an example (as described above with respect to FIG. 4). The current $I_{BOOST,B\text{-}1}$ is provided to $I_{ADJUST}$ 408 based on voltage comparator 504. Voltage comparator 504 receives $V_{CTRL}$ 128 at a first input and receives $V_{BOOST,B\text{-}1}$ at a second input. In this example, $V_{BOOST,B\text{-}1}$ is the threshold voltage $V_{THRESH}$ 404 as described above with respect to FIG. 4. Based on the comparison between control voltage $V_{CTRL}$ 128 and $V_{BOOST,B\text{-}1}$, DAC 116 <B-1> turns on or off. If DAC 116 <B-1> turns on, the current $I_{BOOST,B\text{-}1}$ is provided to $I_{ADJUST}$ 408, and combines with $I_{BIAS}$ 130 to increase $I_{CP}$ 126. If DAC 116 <B-1> turns off, no current is provided by the boost DAC 116. Any number of boost DACs 116 may be present in examples herein, and the values of $V_{BOOST}$ (e.g., $V_{THRESH}$) may be configured to turn on boost DACs 116 at the appropriate $V_{CTRL}$ 128 values to compensate for the varying $K_{VCO}$.

Similarly, "A" attenuation DACs 116 are shown, numbered from <0> to <A-1>. Each attenuation DAC 116 includes a representative current source 508 and a voltage comparator 506. The current source 508 for DAC 116 <A-1> produces a current $I_{ATTEN,A\text{-}1}$, which is current 410 in an example (as described above with respect to FIG. 4). The current $I_{ATTEN,A\text{-}1}$ is pulled from $I_{ADJUST}$ 408 based on voltage comparator 506. Voltage comparator 506 receives $V_{CTRL}$ 128 at a first input and receives $V_{ATTEN,A\text{-}1}$ at a second input. In this example, $V_{ATTEN,A\text{-}1}$ is the threshold voltage $V_{THRESH}$ 404 as described above with respect to FIG. 4. Based on the comparison between $V_{CTRL}$ 128 and $V_{ATTEN,A\text{-}1}$, DAC 116 <A-1> turns on or off. If DAC 116 <A-1> turns on, the current $I_{ATTEN,A\text{-}1}$ is pulled from $I_{ADJUST}$ 408, and reduces $I_{BIAS}$ 130 to decrease $I_{CP}$ 126. If DAC 116 <A-1> turns off, no current is pulled by attenuation DAC 116. Any number of attenuation DACs 116 may be present in examples herein, and the values of $V_{ATTEN}$ (e.g., $V_{THRESH}$) may be configured to turn on attenuation DACs 116 at the appropriate $V_{CTRL}$ 128 values to compensate for the varying $K_{VCO}$.

The PLL shown in FIG. 5 operates similarly to PLL 100 described above. Charge pump 104 provides $I_{CP}$ 126 to LPF 106. LPF 106 provides $V_{CTRL}$ 128 to VCO 108, and VCO 108 provides the output signal Four 132 based on the value of $V_{CTRL}$ 128. To provide a stable bandwidth across the range of $V_{CTRL}$ 128 values, $I_{CP}$ 126 is varied as described herein using DACs 116 to compensate for a varying $K_{VCO}$.

Figure 6:
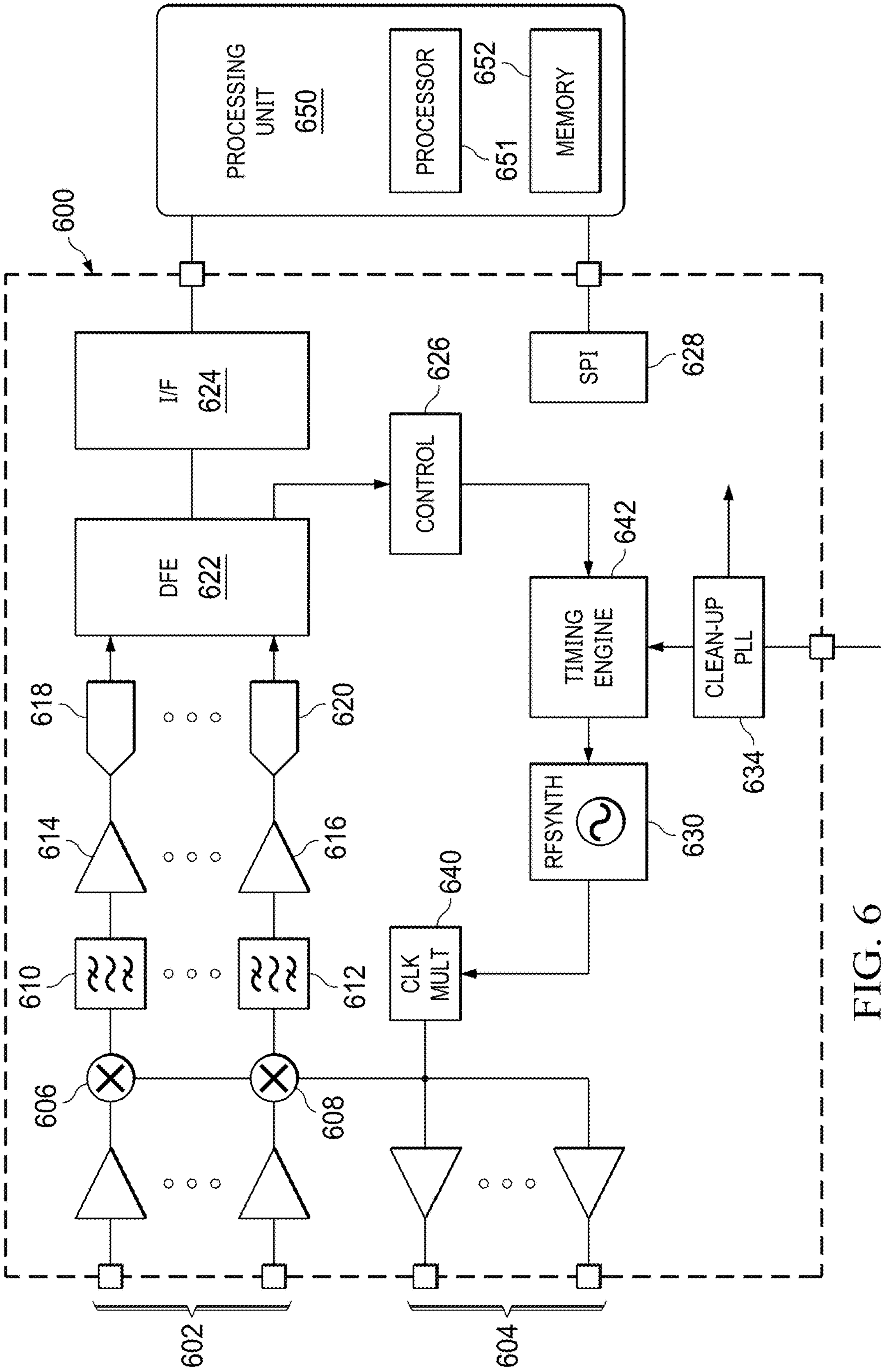
FIG. 6 is a block diagram of a FMCW radar system including a FMCW radar system-on-a-chip (SOC) in accordance with various examples.

FIG. 6 is a block diagram of a FMCW radar system including a FMCW radar SOC in accordance with various examples herein. The radar system includes a processing unit 650 and an FMCW radar SOC 600. In some examples, the processing unit 650 is integrated into the FMCW radar SOC 600. The radar SOC 600 may include multiple transmit channels 604 for transmitting FMCW signals and multiple receive channels 602 for receiving the reflected transmitted signals. Further, the number of receive channels may be larger than the number of transmit channels. For example, the radar SOC 600 may have two transmit channels and four receive channels. A transmit channel includes a suitable transmitter and antenna. A receive channel includes a suitable receiver and antenna. Further, each of the receive channels 602 are identical and include a mixer 606, 608 to mix the transmitted signal with the received signal to generate a beat signal (alternatively referred to as a dechirped signal, intermediate frequency (IF) signal, or raw radar signal), a baseband bandpass filter 610, 612 for filtering the beat signal, a variable gain amplifier (VGA) 614, 616 for amplifying the filtered beat signal, and an analog-to-digital converter ADC 618, 620 for converting the analog beat signal to a digital beat signal.

The receive channels 602 are coupled to a digital front end (DFE) 622 that performs decimation filtering on the digital beat signals to reduce the sampling rate and bring the signal back to baseband. The DFE 622 may also perform other operations on the digital beat signals, e.g., direct current (DC) offset removal. The DFE 622 is coupled to high speed interface component 624 to transfer the output of the DFE 622 to the processing unit 650.

The processing unit 650 may perform all or portions of the method of operating the radar system on the received digital beat signals. The processing unit 650 may include any suitable processor or combination of processors 651. For example, the processing unit 650 may be a digital signal processor, a microcontroller unit (MCU), an FFT engine, a DSP+MCU processor, a field programmable gate array (FPGA), or an application specific integrated circuit (ASIC). In some examples, the processing unit 650 and/or the memory component 652 are integrated into the FMCW radar SOC 600.

The memory component 652 provides storage, e.g., a non-transitory computer readable medium, which may be used, for example, to store software instructions executed by processing unit 650, such as any software instructions for implementing the operations described herein. The memory component 652 may include any suitable combination of read-only memory (ROM) and/or random access memory (RAM), e.g., static RAM.

The control component 626 includes functionality to control the operation of the radar SOC 600. The control component 626 may include, for example, an MCU that executes software to control the operation of the radar SOC 600 between detection mode and operation mode.

The serial peripheral interface (SPI) 628 provides an interface for communication with the processing unit 650. For example, the processing unit 650 may use the SPI 628 to send control information, e.g., timing and frequencies of chirps, enabling of and timing between transmit antennas, output power level, triggering of monitoring functions, etc., to the radar SOC 600.

The programmable timing engine 642 includes functionality to receive chirp parameter values for a sequence of chirps in a radar frame from the control component 626 and to generate chirp control signals that control the transmission and reception of the chirps in a frame based on the parameter values, including timing between chirps generated by different transmit antennas in classification mode, and between chirps generated by the same transmit antenna in detection mode.

The radio frequency synthesizer (RFSYNTH) 630 includes functionality to generate FMCW signals for transmission based on chirp control signals from the timing engine 642. In some examples, the RFSYNTH 630 includes a PLL with a VCO. In one example, the PLL is PLL 100 as described herein.

The clock multiplier 640 increases the frequency of the transmission signal from the RFSYNTH 630 to the frequency of the mixers 606, 608. The clean-up PLL 634 operates to increase the frequency of the signal of an external low frequency reference clock (not shown) to the frequency of the RFSYNTH 630 and to filter the reference clock phase noise out of the clock signal.

Figure 7:
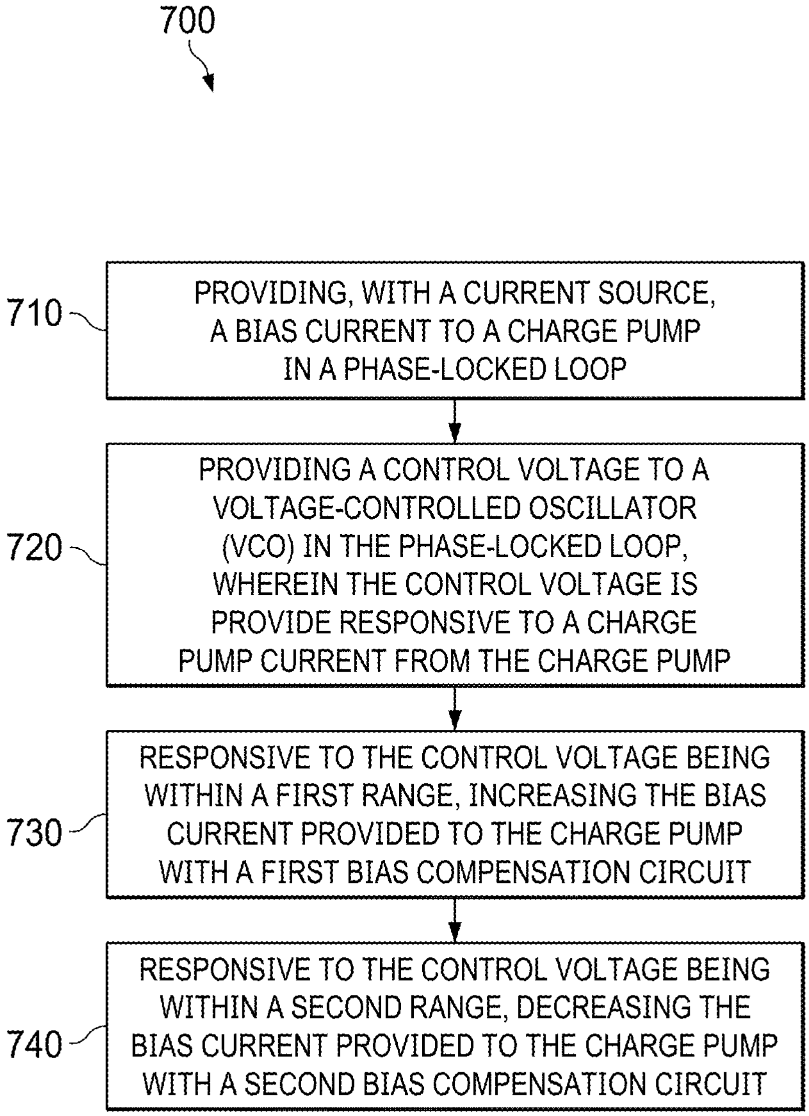
FIG. 7 is a flow diagram of a method for adjusting a charge pump current in a PLL in accordance with various examples.

FIG. 7 is a flow diagram of a method 700 for adjusting a charge pump current in a PLL to compensate for a varying $K_{VCO}$ in accordance with various examples herein. The steps of method 700 may be performed in any suitable order. The hardware components described above with respect to FIGS. 1, 3, 4, 5, and/or 6 may perform method 700 in some examples. Any suitable hardware, software, or digital logic may perform method 700 in some examples.

Method 700 begins at 710, where a current source provides a bias current to a charge pump in a phase-locked loop circuit. In an example, bias current source 114 provides bias current $I_{BIAS}$ 130 as described above. The bias current $I_{BIAS}$ 130 may affect a magnitude of a charge pump current $I_{CP}$ 126 provided by the charge pump and may be used to compensate for non-linear behavior elsewhere in the phase-locked loop circuit.

Method 700 continues at 720, where a LPF 106 provides a control voltage $V_{CTRL}$ 128 to a VCO 108 in the PLL. The control voltage $V_{CTRL}$ 128 is provided responsive to the charge pump current $I_{CP}$ 126 from the charge pump. As described above, $I_{CP}$ 126 is varied via PFD 102 and adjusted using the bias current $I_{BIAS}$ 130 to vary $V_{CTRL}$ 128. $V_{CTRL}$ 128 controls the output signal FOUT 132 provided by VCO 108.

Method 700 continues at 730, where responsive to the control voltage $V_{CTRL}$ being within a first range, increasing the bias current $I_{BIAS}$ 130 provided to the charge pump 104 with a first bias compensation circuit. The first bias compensation circuit may be a boost DAC in this example. As described above, increasing the bias current $I_{BIAS}$ 130 if the $K_{VCO}$ value is low helps to provide a more constant loop bandwidth.

Method 700 continues at 740, where responsive to the control voltage $V_{CTRL}$ 128 being within a second range, decreasing the bias current $I_{BIAS}$ 130 provided to the charge pump 104 with a second bias compensation circuit. The second bias compensation circuit may be an attenuation DAC in this example. As described above, decreasing the bias current $I_{BIAS}$ 130 if the $K_{VCO}$ value is high helps to provide a more constant loop bandwidth. In other examples, more than two DACs or bias compensation circuits may be useful for compensating for a varying $K_{VCO}$ across the control voltage $V_{CTRL}$ 128.

In examples herein, the charge pump current $I_{CP}$ 126 may be varied with $V_{CTRL}$ 128 to compensate for the variation in $K_{VCO}$ caused by the change in $V_{CTRL}$ 128. The loop bandwidth of the PLL is proportional to both $K_{VCO}$ and to the charge pump current $I_{CP}$ 126. Therefore, if $K_{VCO}$ is low for a first range of $V_{CTRL}$ 128 values, $I_{CP}$ 126 may be increased to provide a consistent bandwidth for that first range of $V_{CTRL}$ 128 values. If $K_{VCO}$ is high for a second range of $V_{CTRL}$ 128 values, $I_{CP}$ 126 may be decreased to provide a consistent bandwidth for that second range of $V_{CTRL}$ 128 values. One or more current-steering DACs 116 are used in one example to vary the $I_{CP}$ 126. The current-steering DACs 116 may be configured to provide the appropriate current to compensate for the variation in $K_{VCO}$ for a given VCO. With the examples herein, the full bandwidth for the chirp may be produced by a single VCO, which reduces area and power consumption for a radar system.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement.

In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A system comprising:

a phase-locked loop including a charge pump, and a voltage-controlled oscillator (VCO) coupled to the charge pump, wherein the VCO is configured to receive a control voltage, and the phase-locked loop is configured to output a chirp signal based on the control voltage; and current adjusting circuitry configured to receive the control voltage and control a bias current provided to the charge pump, wherein the current adjusting circuitry is configurable to increase the bias current by a first amount responsive to the control voltage being in a first range, and decrease the bias current by a second amount responsive to the control voltage being in a second range;

wherein the chirp signal has a bandwidth defined by a first bandwidth segment that corresponds to the control voltage being in the first range and a second bandwidth segment that corresponds to the control voltage being in the second range.

2. The system of claim 1, wherein the current adjusting circuitry is further configured to increase the bias current by a third amount responsive to the control voltage being in a third range.

3. The system of claim 1, wherein the current adjusting circuitry includes:

a first current-steering digital-to-analog converter (DAC) configurable to receive the control voltage and source a first current of the first amount responsive to the control voltage being in the first range; and a second current-steering DAC configurable to receive the control voltage and sink a second current of the second amount responsive to the control voltage being in the second range.

4. The system of claim 2, wherein the current adjusting circuitry includes:

a first current-steering digital-to-analog converter (DAC) configurable to receive the control voltage and source a first current of the first amount responsive to the control voltage being in the first range;

a second current-steering DAC configurable to receive the control voltage and sink a second current of the second amount responsive to the control voltage being in the second range; and a third current-steering DAC configurable to receive the control voltage and source a third current of the third amount responsive to the control voltage being in the third range.

5. The system of claim 4, further comprising a voltage threshold circuit configurable to provide respective threshold values to the first, second and third current-steering DACs.

6. The system of claim 4, further comprising a current generator configurable to output a constant current, wherein the bias current is:

a sum of the constant current and the first current when the control voltage is in the first range;

a difference of the constant current and the second current when the control voltage is in the second range; and a sum of the constant current and the third current when the control voltage is in the third range.

7. The system of claim 1, wherein the chirp signal varies in frequency responsive to the control voltage, and a gain of the VCO varies with the control voltage.

8. A system comprising:

a phase-locked loop including a charge pump, and a voltage-controlled oscillator (VCO) coupled to the charge pump, wherein the VCO is configured to receive a control voltage, and the phase-locked loop is configured to output a chirp signal based on the control voltage; and current adjusting circuitry configured to receive the control voltage and control a charge pump current output by the charge pump, wherein the current adjusting circuitry is configurable to cause the charge pump current to increase by a first amount responsive to the control voltage being in a first range, and cause the charge pump current to decrease by a second amount responsive to the control voltage being in a second range;

wherein the chirp signal has a bandwidth defined by a first bandwidth segment that corresponds to the control voltage being in the first range and a second bandwidth segment that corresponds to the control voltage being in the second range.

9. The system of claim 8, wherein the current adjusting circuitry includes:

a current-steering digital-to-analog converter (DAC) having a voltage input coupled to receive the control voltage, the current-steering DAC having a current output; and a current source having a current input coupled to the current output of the current-steering DAC, the current source having a current output configured to output a bias current to the charge pump.

10. The system of claim 9, wherein the current-steering DAC is configurable to source or sink a current to control the bias current output to the charge pump based on the control voltage.

11. The system of claim 8, wherein the current adjusting circuitry is further configurable to cause the charge pump current to increase by a third amount responsive to the control voltage being in a third range.

12. The system of claim 11, wherein the current adjusting circuitry includes:

a first current-steering digital-to-analog converter (DAC) configurable to receive the control voltage and source a first current of the first amount responsive to the control voltage being in the first range;

a second current-steering DAC configurable to receive the control voltage and sink a second current of the second amount responsive to the control voltage being in the second range; and a third current-steering DAC configurable to receive the control voltage and source a third current of the third amount responsive to the control voltage being in the third range.

13. The system of claim 8, wherein the current adjusting circuitry includes a current source having a current output configured to provide a bias current to the charge pump, a plurality of attenuation current-steering digital-to-analog converters (DACs), each coupled to the current output, and a plurality of boost current-steering DACs, each coupled to the current output.

14. The system of claim 13, wherein each attenuation current-steering DAC of the plurality of attenuation current-steering DACs is configured to activate to decrease the bias current based the control voltage, and each boost current-steering DAC of the plurality of boost current-steering DACs is configured to activate to increase the bias current based on the control voltage.

15. A method comprising:

outputting, by a charge pump in a phase-locked loop, a charge pump current;

providing a control voltage to a voltage-controlled oscillator (VCO) in the phase-locked loop;

causing, by current adjusting circuitry, the charge pump current to increase by a first amount, responsive to the control voltage being within a first range;

causing, by the current adjusting circuitry, the charge pump current to decrease by a second amount responsive to the control voltage being within a second range; and causing, by current adjusting circuitry, the charge pump current to increase by a third amount, responsive to the control voltage being within a third range, wherein the first range is less than the second range, which is less than the third range.

16. The method of claim 15, further comprising:

providing a bias current to the charge pump, wherein the amount of bias current provided is based on the control voltage.

17. The method of claim 16, further comprising:

providing, by a current generator, a constant current;

sourcing a first adjusting current of a first amount, by the current adjusting circuitry, responsive to the control voltage being within the first range;

sinking a second adjusting current of a second amount, by the current adjusting circuitry, responsive to the control voltage being within the second range; and sourcing a third adjusting current of a third amount, by the current adjusting circuitry, in a first amount responsive to the control voltage being within the third range.

18. The method of claim 17, wherein the bias current is:

a sum of the constant current and the first adjusting current when the control voltage is within the first range;

a difference between the constant current and the second adjusting current when the control voltage is within the second range; and a sum of the constant current and the third adjusting current when the control voltage is within the third range.

19. The method of claim 16, wherein increasing the bias current increases a bandwidth of the phase-locked loop, and decreasing the bias current decreases the bandwidth of the phase-locked loop.

* * * * *